United States Patent
Morley et al.

(10) Patent No.: US 6,809,470 B2
(45) Date of Patent: Oct. 26, 2004

(54) FLAT PANEL COLOR DISPLAY WITH ENHANCED BRIGHTNESS AND PREFERENTIAL VIEWING ANGLES

(75) Inventors: Roland M. Morley, Tempe, AZ (US); Robert C. Sundahl, Phoenix, AZ (US); Dan Seligson, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 535 days.

(21) Appl. No.: 09/753,361

(22) Filed: Dec. 29, 2000

(65) Prior Publication Data

US 2002/0084952 A1 Jul. 4, 2002

(51) Int. Cl.[7] .............................. H01L 31/12; H01J 5/16
(52) U.S. Cl. ........................ 313/500; 362/235; 362/268
(58) Field of Search ........................ 313/498, 500–512, 313/110, 111; 362/268, 235; 345/76; 359/800

(56) References Cited

U.S. PATENT DOCUMENTS

| | | | |
|---|---|---|---|
| 4,700,206 A | 10/1987 | Yamakawa | |
| 4,703,219 A | 10/1987 | Mesquida | |
| 5,493,427 A | 2/1996 | Nomura et al. | |
| 5,898,191 A | 4/1999 | Kwon et al. | |
| 6,244,727 B1 * | 6/2001 | Ryan, Jr. et al. | 362/244 |
| 6,330,111 B1 * | 12/2001 | Myers | 359/599 |
| 6,345,903 B1 * | 2/2002 | Koike et al. | 362/249 |
| 6,476,783 B2 * | 11/2002 | Matthies et al. | 345/82 |
| 6,535,256 B1 * | 3/2003 | Ishihara et al. | 349/5 |
| 6,570,324 B1 * | 5/2003 | Tutt et al. | 313/500 |

FOREIGN PATENT DOCUMENTS

| | | |
|---|---|---|
| DE | 196 23 881 A1 | 12/1997 |
| EP | 0 798 788 A1 | 10/1997 |
| EP | 1 045 274 A2 | 10/2000 |

* cited by examiner

*Primary Examiner*—Ashok Patel
*Assistant Examiner*—Karabi Guharay
(74) *Attorney, Agent, or Firm*—Marger Johnson & McCollom, P.C.

(57) ABSTRACT

A light directing apparatus comprising an LED array having RGB light emitting diode structures arrayed longitudinally along a substrate to form a plurality of RGB triplet groups and a lenslet array having a plurality of lenslet structures positioned adjacent a respective one of the RGB triplet groups. The lenslet structures include for each respective RGB triplet group a plurality of cylindrical lenses indexed to its respective RGB triplet group. The cylindrical lenses are longitudinally arrayed in parallel to said RGB light emitting diode structures. This arrangement results in greater optical efficiency because light from the LEDs is preferentially directed in a desired direction where an observer is most likely to be.

8 Claims, 4 Drawing Sheets

FLAT PANEL COLOR DISPLAY WITH ENHANCED BRIGHTNESS AND PREFERENTIAL VIEWING ANGLES

BACKGROUND OF THE INVENTION

This invention relates generally to an image formation apparatus which uses a plurality of light emitting elements and, more particularly, to such a system in which an array of such light emitting elements are matched with a lens array for enhancing the illumination pattern preferentially in one direction.

An array of surface-emitting light-emitting diodes (LEDs) is typically manufactured with a 2-dimensional array of the different structures, such as in a Red-Green-Blue (RGB) array where each individual color LED pixel is in the shape of a stripe having an active area whose length is several times greater than its width. The normal optical properties of these LEDs are that the emitted radiation would be in an isotropic pattern, close to a Lambertian.

The isotropic distribution of illumination, which does not favor any one direction or orientation over another, may be the ideal arrangement for some display uses. One example where isotropic illumination may be desired is with a scoreboard at a professional sporting event where fans within the stadium are at all positions relative to the scoreboard—higher, lower, to the left, right and straight on, etc.

Where viewing is predicable, such as billboard signs along a highway, isotropic light distribution is wasteful since only persons in front of and slightly below the sign will be reading the information on the sign. Lenticular arrays, such as fresnel lenses, have been used to focus light from a general light source in a particular direction. But until now, no lens system has specifically addressed LED or pixel-based systems. The present system is adapted to address this deficiency.

BRIEF DESCRIPTION OF THE DRAWINGS

The objects, features and advantages of the invention will become more readily apparent from the following detailed description of a preferred embodiment of the invention that proceeds with reference to the accompanying drawings.

DETAILED DESCRIPTION

In certain key applications, optical efficiency can be greatly enhanced by the introduction of a light-directing layer in front of LED or other pixel-based displays in order to preferentially increase the brightness in a certain direction over other directions.

One important application using this type of display is in signage, where observers looking at the sign are confined within a narrow range of viewing in one (e.g. vertical plane) dimension while maintaining as wide a viewing angle in the orthogonal (horizontal plane) dimension. Typical real world examples where this could be used are road-side signs, elevated signs in public places, etc.

Figure 1:
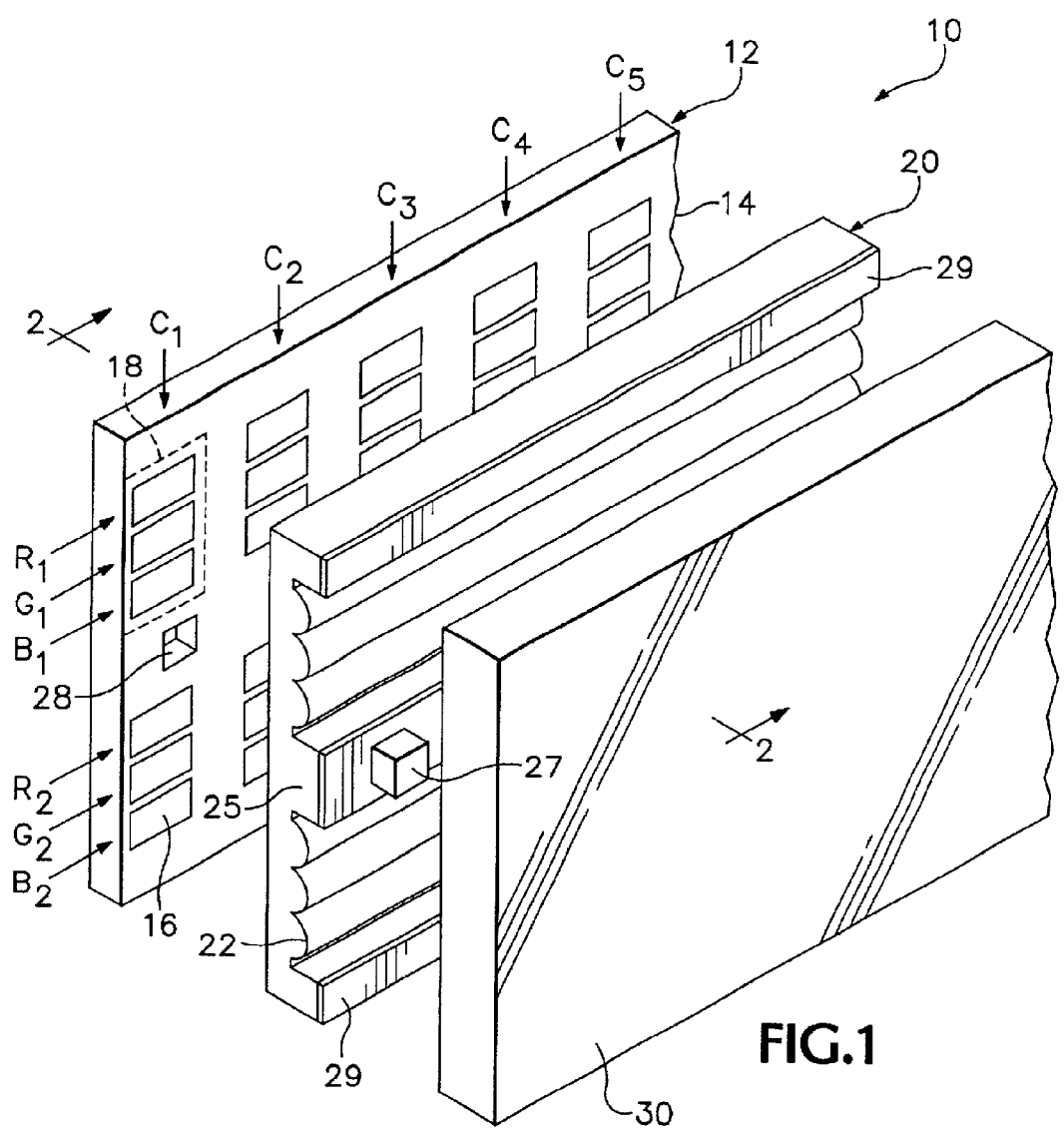
FIG. 1 is an exploded isometric view of a light projection apparatus constructed according to a first embodiment of the invention.
Figures 2, 3:
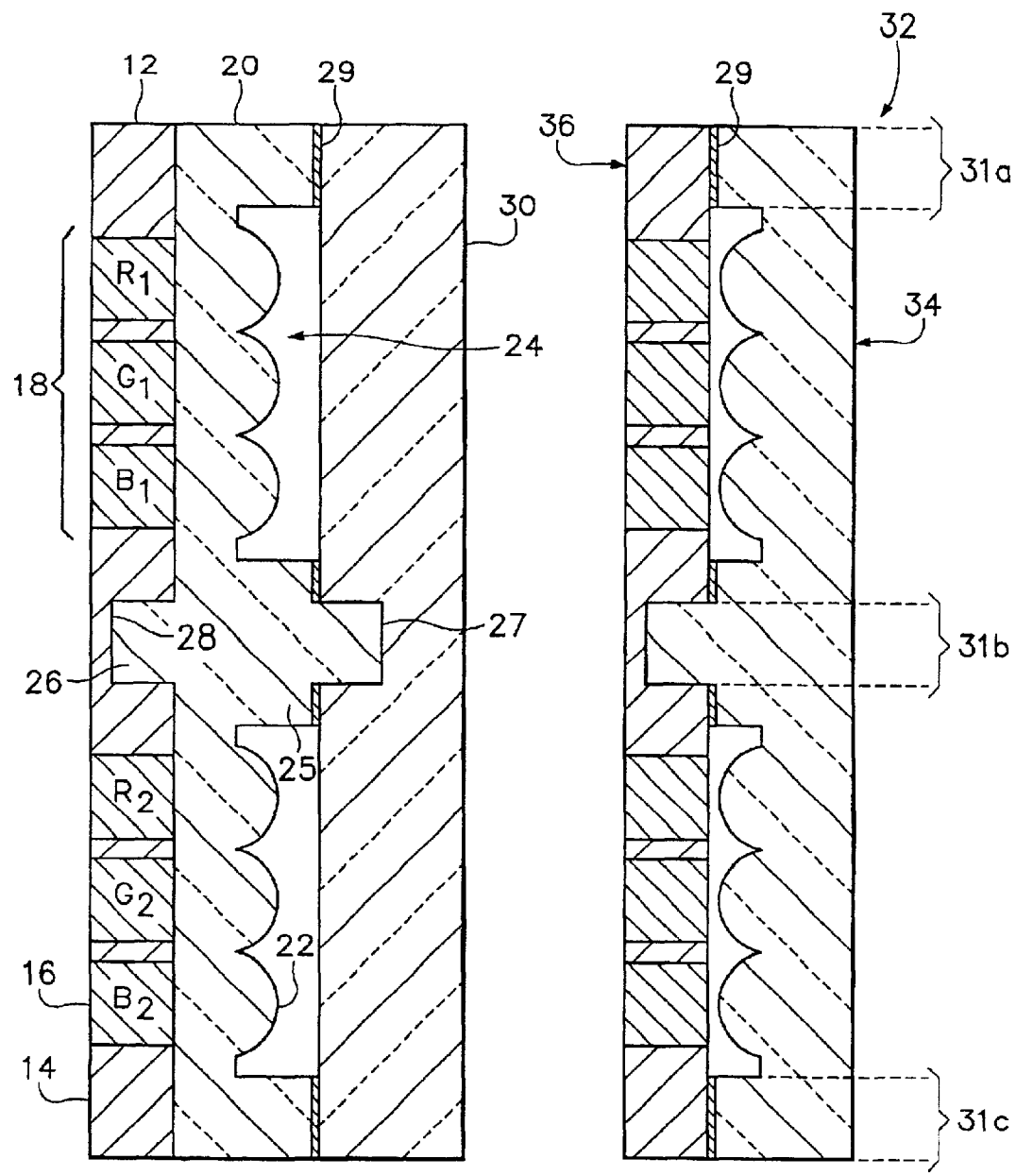
FIG. 2 is a sectioned, side elevation of the apparatus of FIG. 1 taken along line 2—2.
FIG. 3 is a sectioned, side elevation of a light projection display apparatus constructed according to a second embodiment of the invention.

FIG. 1 shows an exploded view of a first embodiment of the light projection display apparatus at 10. FIG. 2 shows the same components in an assemble condition. Display 10 includes a light emitting layer 12, having a substrate 14 on which a plurality of light emitting elements, such as element 16, are formed. The present invention is not intended to be limited to LED technology but also PLED, OLED and LCD displays or other pixel-based display technologies known in the art. In the embodiment shown, element 16 is a sub-pixel of an arrayed LED structure whereby sub-pixel elements of like basic colors are arranged on substrate 14 in a stripe pattern—such as red strip $R_1$, green stripe $G_1$, and blue stripe $B_1$. A second set of sub-pixel stripes are shown as $R_2$, $G_2$ and $B_2$. It is understood that typical LED displays have a large number of such stripe sets—for instance, an LED display having an XGA resolution will have 768 sets of stripes. Adjacent sub-pixel elements from each of the three stripes form an RGB triplet group 18. The brightness of each of the sub-pixels within group 18 can be controlled to form a display pixel having a perceived desired color. The LED pixels are arranged by row and column (e.g. $C_1, C_2 \ldots C_5 \ldots C_n$) to form addressable display units. An XGA display, for instance, will have 1024 such columns.

Display 10 also includes light directing layer 20, adjacent to light emitting layer 12, having an array of light directing elements, such as cylindrical lens 22, in substantial registry with light emitting elements 16. In the embodiment shown, light directing layer 20 includes a plurality of lenslet structures 24 each comprised of three cylindrical lenses 22 having a long axis parallel to and aligned with the long axis of the LED stripes $R_2$, $G_2$ and $B_2$. The advantage of such lenses in combination with the light emitting elements is explained in more detail below with reference to FIGS. 4A to 6B.

Lenses 22 have a flat surface laying against respective sub-pixel elements 16 and an opposed cylindrically curved surface spaced from the sub-pixel element. Lenslet structures 24 are separated from adjacent lenslet structures on the light directing substrate by dividers 25 that extend past the curved surfaces of the lenses. Assembly of the LED structure to the light directing layer 20 is by a continuous optical bond, and utilizes molded features in the lenslet plate for precise alignment of the LEDs to the lenses. To this end layers 12 and 20 include complimentary structures—here flange 26 formed on light directing layer 20 received within gap 28 formed on light emitting layer 12—forming an alignment means for indexing layer 20 relative to layer 12. The location of these complimentary structures can be modified so that when layer 12 is coupled to layer 20 via these structures, the lenses of the light directing layer can be offset relative to respective sub-pixel elements of the light emitting layer thereby directing the light in a desired direction (upward or downward) as will be appreciated below.

As the cylindrical lenses 22 of light directing layer 20 point outward from the light emitting layer, an optical integrator plate 30 is coupled over the light directing layer. Optical integrator plate 30 is preferably formed of glass and is affixed to layer 20 by means of an optical adhesive having an index of refraction that falls between the index of refraction of the light directing layer 20 and the index of refraction of the plate 30 in order to reduce internal reflections. The assembly may also include complimentary structures, such as projection 27 received within a respective gap formed within the optical integrator plate 30, to assist fixation of plate 30 to layer 20.

The present design makes use of an array of cylindrical lenses placed close in front of the LED array. Each lens relates to an individual colored pixel LED structure, and acts as a collector for the emitted light. By using a cylindrical lens, with the long axis of the lens aligned with the long direction of the LED, the light emitted from the LED in the plane containing the long axis is not focussed, and the light emitted in a plane perpendicular to the long axis is focussed by the curvature of the lens. The amount of focussing is dependent on the geometry of the LED surface, the cylindrical lens shape and its separation from the LED.

The light directing layer 20, with typical feature sizes of 1 mm, and thickness 1–2 mm, is constructed from an optical grade thermoplastic material such as acrylic or polycarbonate. Light directing layer 20 can also be formed of molded glass and contains the lens structure as well as mechanical features 26 for positioning and aligning the lenses to the LED structure. Layer 20 can be formed by extrusion, compression molding or injection molding, depending on the choice of material, the overall sizes required for the application, and the tolerances allowed on feature position and surface finish.

FIG. 3 illustrates an alternate embodiment of the invention at 32 where the light directing layer 34 is reversed in relation to the light emitting layer 36 so that the curved surfaces of the cylindrical lenses of layer 34 faced inward toward, and are directly opposed to, the sub-pixel light emitting elements of layer 36. It will be appreciated that no optical integration plate, such as plate 30 of the embodiment shown in FIGS. 1 and 2, is necessary since the curved surfaces of the lens structures of the alternate embodiment face inward and thus are not exposed to physical damage as with the first embodiment.

To improve display contrast between those portions of the assembly illuminated by active portions and inactive portions of light emitting layer 12, the inactive portions are coated with a light absorptive material such as black paint or other material known in the art. Preferred coated regions are shown the drawings as the heavily cross-hatched layers 29 formed between the light directing layer 20 and optical integrator plate 30 in FIGS. 1–2, and between the light emitting layer 12 and light directing layer 20 within the bounded regions shown by dashed lines at 31a, 31b and 31c.

Figure 4A:
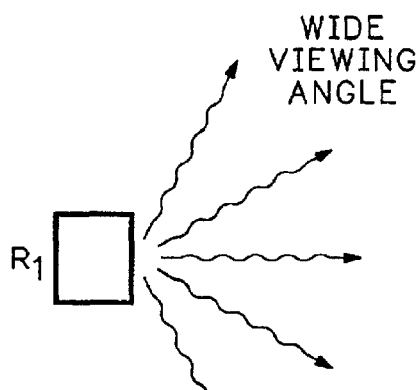
FIGS. 4A and 4B illustrate the emitted radiation pattern of a single prior art LED pixel without the benefit of the present invention.
Figure 4B:
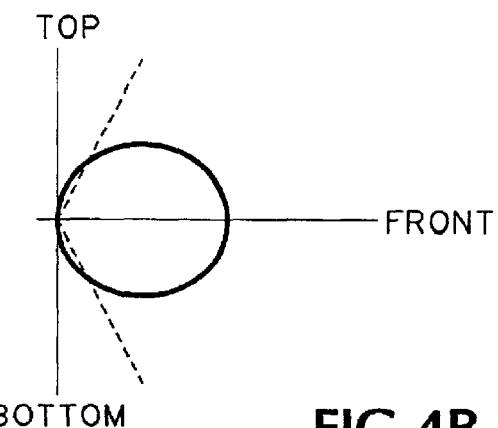

FIGS. 4A and 4B illustrate the light emission pattern of a typical LED such as one used within the light emission layer 36. The normal optical properties of these LEDs is that the emitted radiation would be in an isotropic, close to a Lambertian, pattern. The graph in FIG. 4B shows how the brightness of the light is distributed across a wide viewing angle (shown by dashed lines) across the vertical dimension.

Figure 5A:
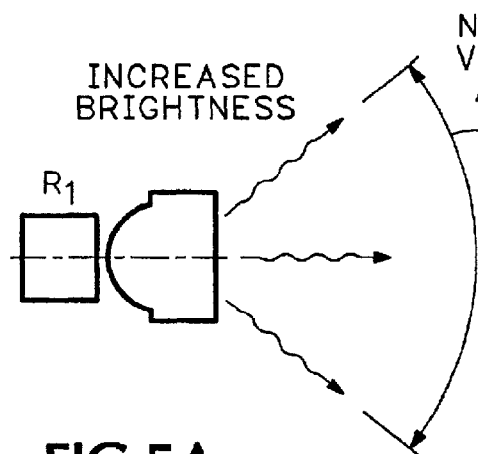
FIGS. 5A and 5B illustrate the emitted radiation pattern of a single pixel-lens assembly of FIG. 3 arranged in a first position relative to one another for preferential viewing of the pixel output in a straight ahead direction.
Figure 5B:
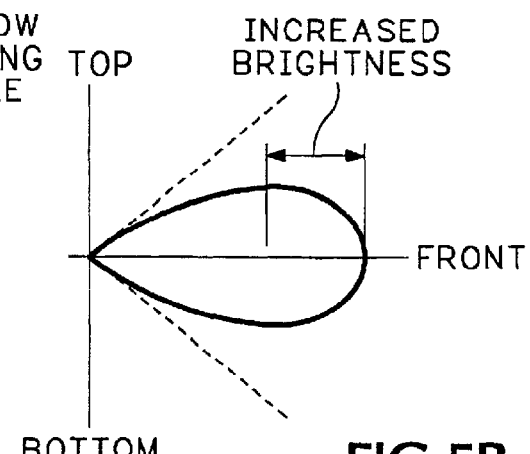

FIGS. 5A and 5B illustrate how adding a cylindrical or other type of convergent lens structure in front of the LED focuses the light in a forward direction. The resulting light distribution across the vertical dimension, as seen in the graph of FIG. 5B, yields an increased brightness in the forward direction but with a narrower optimal viewing angle (shown by the dashed lines).

Figure 6A:
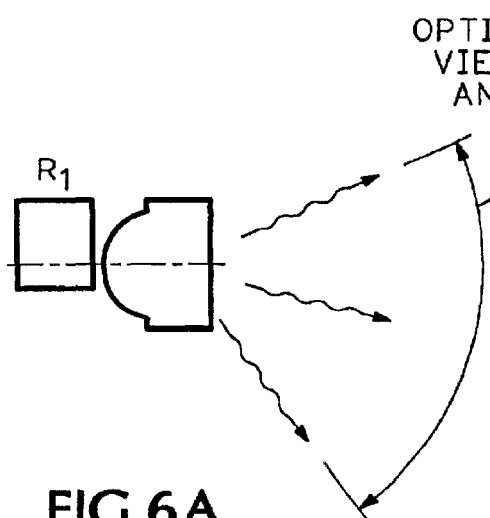
FIGS. 6A and 6B illustrate the emitted radiation pattern of a single pixel-lens assembly of FIG. 3 arranged in a second position relative to one another for preferential upward viewing of the pixel output from a position located below and to the right of the light emitting element.
Figure 6B:
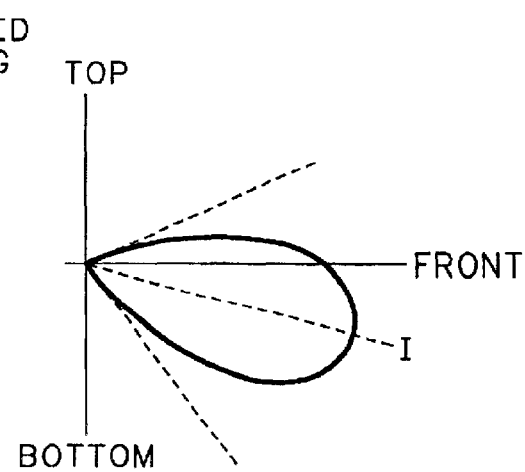

FIGS. 6A and 6B illustrate how displacing or indexing the lens vertically relative to the LED alters the direction of the optimal viewing angle. In the graph of FIG. 6B, the optimal viewing angle is displaced downward (so that it is best when viewed upward toward the light emitting element) so that brightness is at a maximum along axis I as the lens is displaced downward relative to its respective light emission element. This is in contrast with FIGS. 5A and 5B where the lens structure is horizontally aligned with the LED, thus resulting in a maximal brightness along the horizontal direction.

Figure 7:
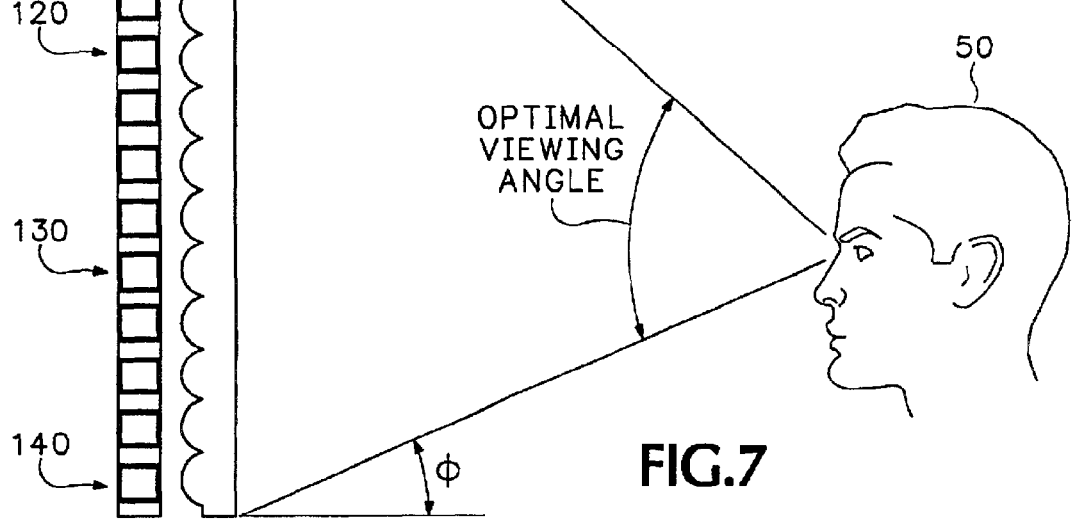
FIG. 7 is a schematic side elevation of a pixel-lens array assembly arranged for asymmetric distribution of illumination from the array of LEDs of FIG. 3.

Very large arrays of light emitting elements, which subtend large angles at the observer, may be constructed with illumination patterns which vary across one dimension of the array (e.g. the vertical dimension) in order to preserve the far field illumination pattern of all parts of the display. This can be accomplished as shown in FIG. 7 where the pitch between adjacent light directing elements is slightly less than the pitch between adjacent light emitting elements. From the view of observer 50, the display formed from light emitting elements 34 subtends an angle of θ+Φ. The brightness of the sign from the observer's point of view can be maximized according to the practice of the invention by reducing the distance between the lens centers compared to those of the light emitting pixel elements.

This is in contrast to displays that would not typically subtend a large viewing angle from the observer's perspective, such as an illuminated street sign. In this case, it would be more useful to preferentially direct the light emitted from all areas of such a sign in the same general direction whereby the offset of each lenslet structure (as in FIG. 5A) from a respective pixel element is identical for all lens-pixel (or stripe) pairs. In the display of FIG. 7, however, a first of the lenslet structures (e.g. in pair 110) is offset from a first respective one of the RGB triplet groups by an amount that is different than an offset between a second of the lenslet structures (e.g. in pair 120) relative to its respective RGB triplet group.

Figure 8:
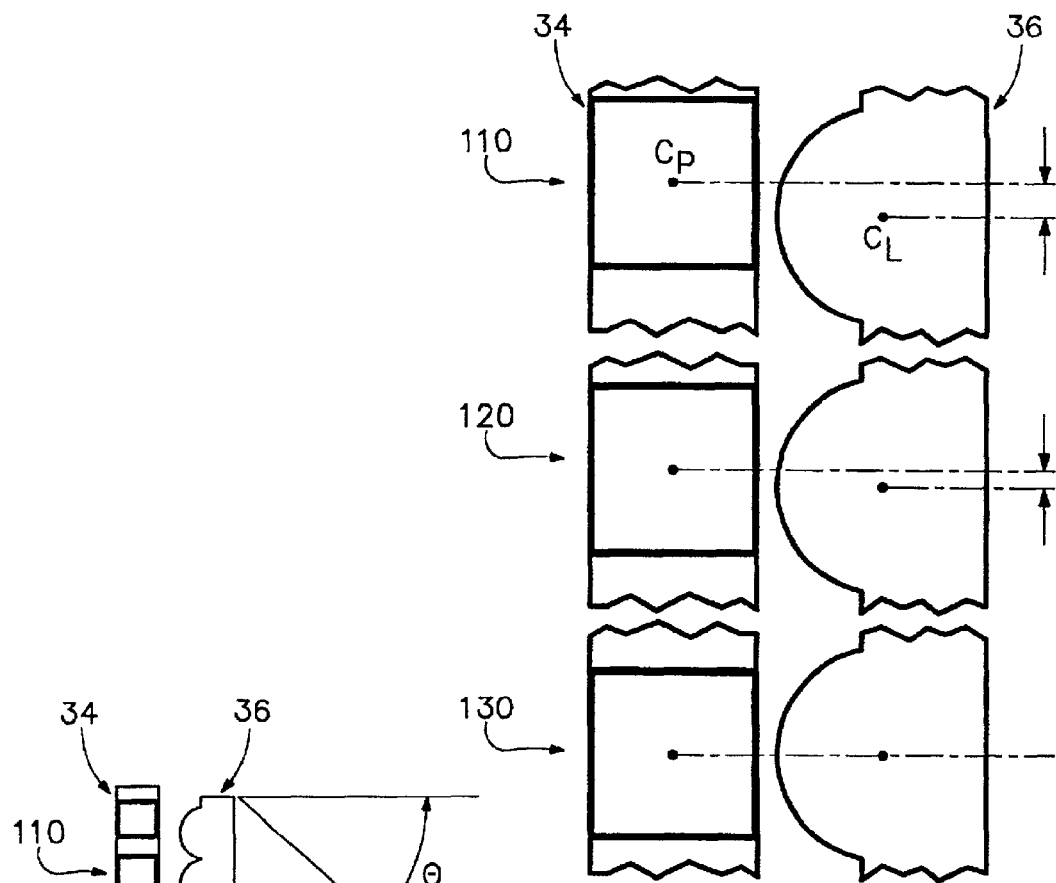
FIG. 8 is a side elevation view of three of the individual pixel-lens assemblies of FIG. 7.

Pixel-lens pairs are shown at 110, 120 and 130 in FIGS. 7 and 8. Pair 110 is located near the top of the display whereby the lens center $C_L$ is shifted downward relative to the pixel center $C_p$. This shifting or indexing of the lens relative to the light emitting element yields a preferential viewing angle of the pixel in pair 110 in a direction toward a point located approximately θ downward from the pair 110. Pair 130 is located at approximately eye level to observer 50 and thus it is desired that maximal brightness be in the horizontal direction where the lens and pixel centers are not offset. Pair 120 is located approximately midway between pairs 110 and 130 and thus the light directing element and light emitting elements should be arranged so that maximal brightness is transmitted in a direction that is approximately ½θ downward. Finally, pair 140 is located at the bottom of the display and below the eye level of observer 50. It is preferred, therefore, that the lens center be higher relative to the associated pixel center to maximally direct light from the pixel in an upward direction at angle Φ.

The optimal viewing angle transmitted through the light-directing element from the light-emitting element is a factor of the height h of the pixel (or sub-pixel) element and the spacing t of the microlens from the pixel according to the following formula:

$$\text{Viewing Angle} = 2 \times \arctan(h/2t)$$

This practical limit must be greater than the viewing angle range expected for the display, i.e. the angle included by the shortest observer looking at the top of the display and the tallest observer looking at the bottom of the display. Another effect of the invention is to increase the perceived fill factor of the display by a factor G that is dependent upon the transmission T of the lenslet material, the open area (height) d of the microlens, and the height h of the pixel according to the following formula:

$$G = T \times d/h$$

Fill Factor is the percentage of the total display area that is covered by active LEDs. Current displays typically have a fill factor in the range of between about 0.25 to 0.50. The significance of the optical gain effect is that the display brightness is spread over a larger area, effectively increasing the fill factor, or increasing the "space-averaged" luminance (brightness) of the display. Space-averaged luminance is the LED luminance multiplied by the Fill Factor.

There are several key attributes of the present invention. First, the cylindrical lens arrangement is relatively simple to manufacture in a plastic substrate. Second, the cylindrical shape, oriented parallel to the long direction of the LED emitters, provides for efficient control of illumination and maximum optical gain. Third, the displays can be produced with customized directional illumination patterns by indexing the position of the lens array relative to the LED array. As an example, if the lenslets centers are displaced downward from the pixel centers, then the central illumination direction maximum (for optimal viewing) will be located downward. Fourth, the lenslet plates may be designed and fabricated to match other pixel designs, featuring sub-pixels laid out in a different pattern that that shown in FIG. 1. Finally, very large arrays, which subtend large angles at the observer (as in FIG. 7), may be constructed with illumination patterns that vary across one dimension of the array in order to preserve the far field illumination pattern of all parts of the display. This will have the effect of optimizing the illumination uniformity of all parts of the display. This can be achieved by producing a lenslet structure that has a pitch (distance between lenses) that is slightly less than the pitch of the display active elements. It is preferred that the cylindrical lens structure should be close, i.e. on the order 1 to 3 times the pixel to pixel spacing in front of the LEDs. In typical present day display systems, microlenses would be placed from 1.5 to 5 millimeters in front of the LEDs.

Having described and illustrated the principles of the invention in a preferred embodiment thereof, it should be apparent that the invention can be modified in arrangement and detail without departing from such principles. Accordingly, we claim all modifications and variation coming within the spirit and scope of the following claims.

What is claimed is:

1. A light directing apparatus comprising:
    a light emitting layer including an array of light emitting elements, a light directing layer adjacent to the light emitting layer, said light directing layer including an array of light directing elements in substantial registry with said array of light emitting elements, further including means for indexing said light emitting layer relative to said light directing layer.

2. The apparatus of claim 1, said means for indexing including complimentary molded features on said light emitting layer and said light directing layer adapted to align said light emitting layer with said light directing layer.

3. The apparatus of claim 2, wherein said light emitting elements are arranged along a substrate to form a plurality of parallel stripes and said light directing elements are cylindrical lenses each of the lenses having a long axis parallel to a respective stripe.

4. A light directing apparatus comprising:
    a light emitting layer including an array of light emitting elements;
    a light directing layer adjacent to the light emitting layer, said light directing layer including an array of light directing elements in substantial registry with said array of light emitting elements;
    an optical integration plate adjacent the light directing layer; and
    an optical adhesive between the light directing layer and the optical integration plate, wherein said optical adhesive has an index of refraction that falls between an index of refraction of the light directing layer and an index of refraction of the optical integration plate.

5. A light directing apparatus comprising:
    an LED array having RGB light emitting diode structures arrayed longitudinally along a substrate to form a plurality of RGB triplet groups; and
    a lenslet array having a plurality of lenslet structures, each one of the lenslet structures positioned adjacent a respective one of the RGB triplet groups, said lenslet structures including for each respective RGB triplet group a plurality of cylindrical lenses indexed to said respective RGB triplet group said cylindrical lenses being longitudinally arrayed in parallel to said RGB light emitting diode structures.

6. The apparatus of claim 5, wherein each of said lenslet structures is offset from each of said respective RGB triplet groups by an identical amount.

7. The apparatus of claim 5, wherein a first of said lenslet structures is offset from a first respective one of said RGB triplet groups by an amount that is different than an offset between a second of said lenslet structures and said second respective one of said RGB triplet groups.

8. The apparatus of claim 5, further including a contrast-enhancing coating formed within inactive regions of the light directing apparatus.

* * * * *

UNITED STATES PATENT AND TRADEMARK OFFICE
CERTIFICATE OF CORRECTION

PATENT NO. : 6,809,470 B2                           Page 1 of 1
DATED      : October 26, 2004
INVENTOR(S) : Morley et al.

It is certified that error appears in the above-identified patent and that said Letters Patent is hereby corrected as shown below:

Column 5,
Line 53, replace "elements, a light" with -- elements; a light --.

Column 6,
Line 39, replace "respective RGB triplet group said" with -- respective RGB triplet group, said --.

Signed and Sealed this

Twenty-second Day of November, 2005

JON W. DUDAS
*Director of the United States Patent and Trademark Office*